United States Patent [19]

Sakai et al.

[11] Patent Number: 4,992,837
[45] Date of Patent: Feb. 12, 1991

[54] LIGHT EMITTING SEMICONDUCTOR DEVICE

[75] Inventors: Kazuo Sakai; Yukitoshi Kushiro; Kohsuke Nishimura, all of Tokyo, Japan

[73] Assignee: Kokusai Denshin Denwa Co., Ltd., Tokyo, Japan

[21] Appl. No.: 432,641

[22] Filed: Nov. 7, 1989

[30] Foreign Application Priority Data

Nov. 15, 1988 [JP] Japan .................. 63-286895
Jan. 24, 1989 [JP] Japan .................. 1-13127
Jan. 24, 1989 [JP] Japan .................. 1-13128

[51] Int. Cl.$^5$ .......................... H01L 33/00
[52] U.S. Cl. ....................... 357/17; 357/16; 357/61; 357/30; 372/43; 372/44; 372/45
[58] Field of Search ............ 357/16, 17, 61, 30 B, 357/30 E, 30 L; 372/43, 44, 45

[56] References Cited

U.S. PATENT DOCUMENTS 4,573,161 2/1986 Sakai et al. .................. 372/45

FOREIGN PATENT DOCUMENTS 0173893 9/1985 Japan .................. 372/43
0178684 9/1985 Japan .................. 372/43
0140588 6/1988 Japan .................. 372/43
0237590 10/1988 Japan .................. 372/43

OTHER PUBLICATIONS

Harris et al., "Growth and Properties . . . $Hg_{1-x}Mn_xTe$", Appl. Phys. Lett., 49(12), 9/22/86.
Gunshor et al., "Diluted Magnetic Semiconductor Superlattices", Journal of Crystal Growth, 72, 1985.

*Primary Examiner*—Rolf Hille
*Assistant Examiner*—Minh Loan Tran
*Attorney, Agent, or Firm*—Armstrong, Nikaido, Marmelstein, Kubovcik & Murray

[57] ABSTRACT

A light emitting semiconductor device which emits blue and/or green light has an active layer and a pair of clad layers which sandwich the active layer, and which are deposited on a semiconductor substrate. The substrate is made of one of GaAs, GaP, InP, Si, Ge, ZnSe and mixed crystals of GaAsP. The active layer is made of at least one of II-VI group compound semiconductor, I-III-VI$_2$ group compound semiconductor, and II-IV-V$_2$ group compound semiconductor. The clad layer is made of II-transition metal-VI group compound semiconductor, which is lattice-matched to the active layer.

9 Claims, 4 Drawing Sheets

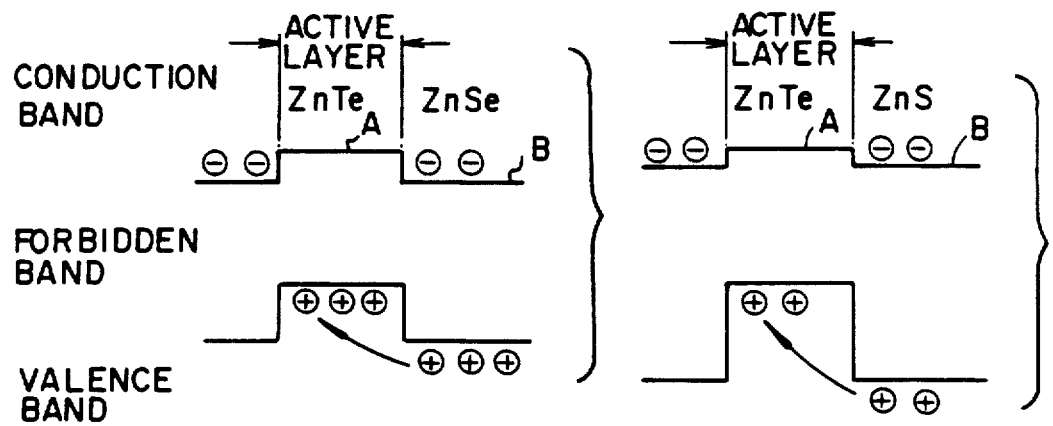
FIG. 2(a)
PRIOR ART
FIG. 2(b)
PRIOR ART
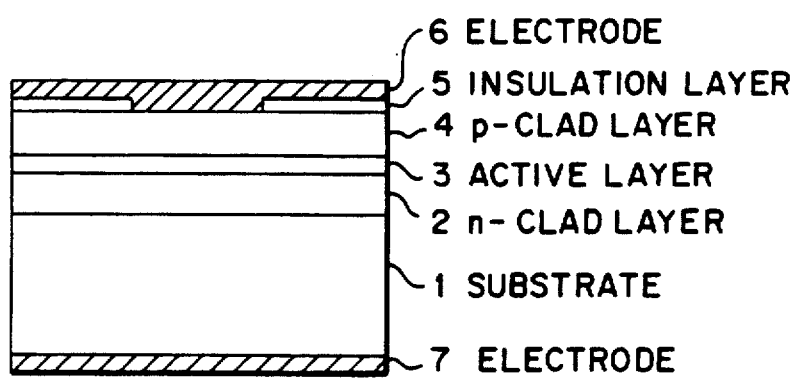
FIG. 3

LIGHT EMITTING SEMICONDUCTOR DEVICE

BACKGROUND OF THE INVENTION

The present invention relates to a light emitting semiconductor element for emitting green or blue light.

Optical information technology has lately developed very rapidly with the increased production of laser discs and/or laser printers. Those devices have a semiconductor laser which emits red light as a light source. In order to achieve the high capacity recording, high speed reading, and/or high speed printing, the light source must be not only of a high power, but also short in wavelength. Although a short wavelength semiconductor has been proposed, a semiconductor laser which emits green or blue light (wavelength is 0.3–0.6 micron) has not yet been obtained. Further, a blue light emitting diode is necessary for providing full color display using light emitting diodes, however, no such diode has been obtained.

As for a short wavelength light emitting semiconductor element, in particular one which emits green and/or blue light, because of restriction of the energy gap, not only the II-IV group compound semiconductor like ZnS, ZnSe, and ZnTe, but also I-III-VI$_2$ group (like Cu(GaAl)(SSe)$_2$ et al) compound semiconductor called chalcopyrite type, and/or II-IV-V$_2$ group ((CdZn)(GeSi)P$_2$ et al) compound semiconductor is promising.

FIG. 1 shows the relationships between the energy gap (horizontal axis) and the lattice constant (vertical axis) of II-VI group compound semiconductor, I-III-VI$_2$ group compound semiconductor, II-IV-V$_2$ group compound semiconductor, and mixed crystals of the same.

It is clear from FIG. 1 that ZnSSeTe in II-VI group can not provide a crystal composition in which an active layer and a clad layer are lattice-matched to a substrate as the energy gap difference is higher than 0.2 eV. Further, in case of hetero junction of ZnSe-ZnTe or ZnS-ZnTe, the bottom of the conduction band of ZnTe is higher than the bottom of the conduction band of ZnS or ZnSe, as shown in the energy-band diagram of FIGS. 2A and 2B. Therefore, in case of ZnSSeTe group, an electron is not effectively confined in an active layer, and no double hetero structure which operates stably has been obtained. Further, the II-VI group compound semiconductor crystal has a strong ionization tendency, and therefore, the control of conductivity by adding an impurity is difficult. Therefore, a current injection type light emitting diode using p-n junction has not been developed.

Thus, I-III-VI$_2$ group chalcopyrite type compound semiconductor, and II-IV-V$_2$ group chalcopyrite type compound semiconductor are considered promising, instead of a prior II-VI group compound semiconductor.

However, the chalcopyrite type semiconductor, which has a high energy gap, has the disadvantage that controlling the conductivity by adding an impurity is difficult, and a p-n junction is difficult to produce. This is the same as is in the case of ZnSSeTe group. Further, when a double hetero junction structure is produced, the semiconductors of the same group can not provide the large difference of the energy gap between an active layer and a clad layer.

Further, if we try to produce a chalcopyrite type active layer and II-IV group clad layer, the energy gap difference is not sufficient, and/or ZnSSeTe group cannot provide a p-n junction as described above.

Accordingly, a light emitting semiconductor device having an active layer by I-III-VI$_2$ group or II-IV-V$_2$ group chalcopyrite type compound semiconductor has been very difficult to produce.

As described above, prior compound semiconductors such as II-VI group, I-III-VI$_2$ group, or II-IV-V$_2$ group chalcopyrite type used for providing an active layer for green or blue light can not provide a suitable clad layer because of a deficiency in conductivity control by impurity, sufficient energy gap difference between an active layer and a clad layer, and lattice matching to a substrate.

SUMMARY OF THE INVENTION

It is an object, therefore, of the present invention to overcome the disadvantages and limitations of the prior light emitting semiconductor device by providing a new and improved light emitting semiconductor device.

It is also an object of the present invention to provide a light emitting semiconductor device for blue and/or green light having enough energy gap between an active layer and a clad layer for confining carriers.

The above and other objects are attained by a light emitting semiconductor device comprising a substrate; a clad layer contacting with an active layer, deposited on said substrate; wherein said clad layer comprises II-transition metal-VI group compound semiconductor, which is lattice-matched to the semiconductor of said active layer.

BRIEF DESCRIPTION OF THE DRAWINGS

The foregoing and other objects, features, and inherent advantages of the present invention will be appreciated and become better understood by means of the following description and accompanying drawings wherein;

FIG. 3 is a cross section of a semiconductor device according to the present invention.

DESCRIPTION OF THE PREFERRED EMBODIMENTS

In order to emit blue or green light by a semiconductor device, it is essential that the semiconductor of an active layer has an energy gap between 2.0 eV and 4.0 eV (electron volt), and that the semiconductor of the active layer is lattice-matched to that of a clad layer. Preferably, the energy gap of a semiconductor of a clad layer is higher than that of an active layer. Preferably, the semiconductor of an active layer and/or a clad layer is also lattice-matched to the semiconductor of a substrate. The principle idea of the present invention is in the use of a transition metal in a clad layer. Some embodiments will now be described.

Embodiment 1

FIG. 3 shows the first embodiment of the present invention for a short wavelength light emitting semiconductor device. A blue light emitting semiconductor device is described in the following embodiments. The ratio of the components in the following descriptions is an atomic ratio.

In the figure, the numeral 1 is an n-GaP substrate, 2 is an n-side clad layer of about 2 $\mu$m thickness made of n-$Zn_{0.82}Mn_{0.18}S_{0.98}Se_{0.01}Te_{0.01}$ (atomic ratio), 3 is an active layer made of $ZnS_{0.9}Se_{0.05}Te_{0.05}$ (atomic ratio) having the thickness about 0.2 $\mu$m, 4 is a p-side clad layer of about 2 $\mu$m thickness made of p-$Zn_{0.82}Mn_{0.18}S_{0.98}Se_{0.01}Te_{0.01}$, 5 is an insulation layer, 6 and 7 are electrodes for external connection. The n-side clad layer 2, and the p-side clad layer 3 have the carrier density higher than $10^{18} cm^{-3}$ by doping Cl, and Li, respectively.

Figure 1:
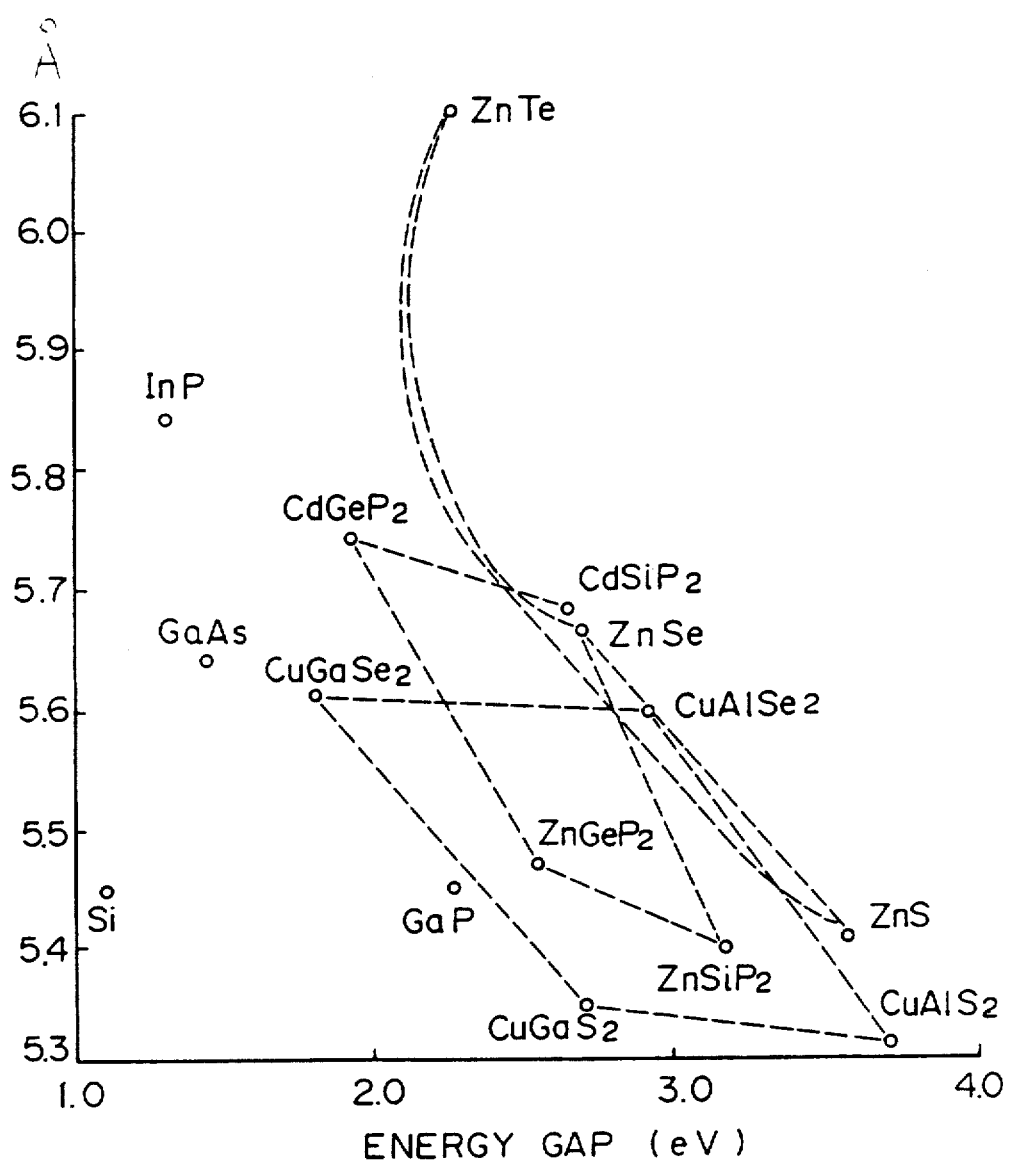
FIG. 1 shows the relations between energy gap and lattice constant of some semiconductors, FIG. 2 show the energy-band structure of a prior ZnSe-ZnTe, and ZnS-ZnTe hetero junction.
Figure 4:
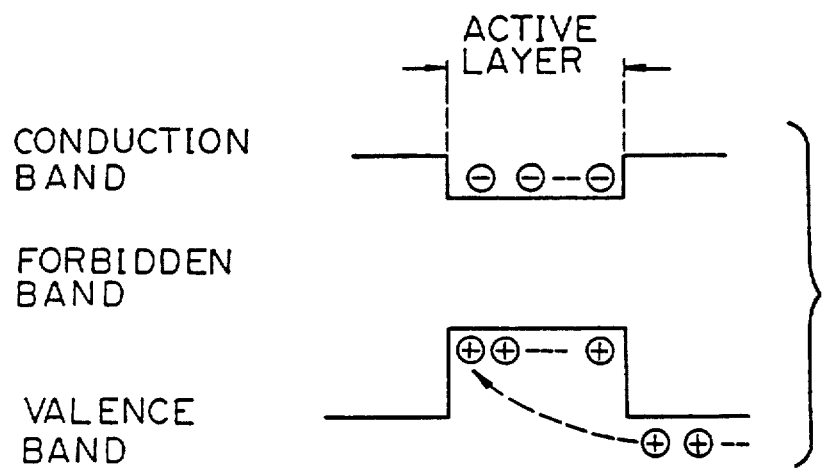
FIG. 4 shows the energy band structure of the semiconductor device of FIG. 3.

In the structure of the figure, the lattice constants of the substrate 1, the clad layers 2 and 4, and the active layer 3 are approximately matched, and the energy difference between the active layer 3, and the clad layers 2 and 4 is approximately 0.3 eV. Since Mn is added, the electron affinity between the clad layers 2 and 4 is small, and the hetero interface becomes the band structure as shown in FIG. 4, in which an electron and a positive hole are confined in an active layer completely. The energy differences in a conduction band and a valence band are 0.2 eV, and 0.1 eV, respectively. Therefore, the confinement of an electron and a positive hole is complete.

When an active layer 3 is made of chalcopyrite type compound semiconductor, for instance,

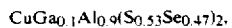

the energy difference between an active layer and clad layers 2 and 4 is approximately 0.6 eV, and therefore, the carrier confinement is further complete.

As described above, a part of Zn which is a II group metal is substituted with Mn, or a transition metal Fe, Co, Ni so that an active layer and a pair of clad layers on both sides of the active layer are lattice-matched to a substrate 1, and thus, the confinement of a carrier into an active layer is complete. It is preferable that the difference of the lattice constants is equal to or less than 0.1 Å. If the difference of the lattice constants is larger than that value, an undesirable lattice-defect is generated, and the oscillation threshold of a laser is undesirably increased. Thus, a blue light emitting (wavelength is 0.37 $\mu$m in the present embodiment) injection type semiconductor device is obtained.

When green light is desired, a substrate is made of GaAs, the composition ratio y of an active layer made of $ZnS_{1-x-y}Se_xTe_y$ ($0 \leq x \leq 1$, $0 \leq y \leq 1$) is increased, and the composition ratio q in the clad layers 2 and 4 made of $Zn_{1-w}Mn_wS_{1-p-q}Se_pTe_q$ ($0 \leq p \leq 1$, $0 \leq q \leq 1$) is also increased.

Embodiment 2

The embodiment 1 shows one example in which a substrate 1 is made of GaP. The present invention is not restricted to that embodiment.

When a substrate 1 is made of GaP or Si, an active layer 3 is made of $ZnS_{1-x-y}Se_xTe_y$ ($0 \leq x \leq 1$, $0 \leq y \leq 1$, $0.07 \leq x + 2.6y \leq 0.2$) which belongs to II-VI group compound, or $CuAl_xGa_{(1-x)}(S_ySe_{(1-y)})_2$ which belongs to chalcopyrite type compound. The composition of clad layers 2 and 4 in that case is $Zn_{(1-w)}Mn_wS_{1-p-q}Se_pTe_q$ ($0 \leq p \leq 1$, $0 \leq q \leq 1$, $0.05 \leq w \leq 0.5$, $0 \leq p + 2.6q \leq 0.06$). The layer structure of that composition which is lattice-matched to a substrate 1, provides excellent carrier confinement, easy control of the conduction type, and can emit short wavelength light.

Embodiment 3

The embodiments 1 and 2 shows a conventional double hetero structure. In another embodiment of the present invention, at least one layer of an active layer 3 and clad layers 2 and 4 may be a super-lattice structure having laminated ultra-thin films in which each ultra-thin film has a thickness smaller than 300 Angstrom. The super-lattice structure has the advantage that the zinc blend structure is kept even when Mn is included, as compared with a bulk structure of the embodiments 1 and 2. Therefore, the composition may include more Mn as compared with that of a bulk structure, resulting in excellent carrier confinement. Further, when the clad layers 2 and 4 are in a super-lattice structure, it is expected that super-lattice layer on an interface plane to a substrate 1 functions to prevent the diffusion of impurity atoms from the substrate 1. For instance, the diffusion of Si, Ga and/or P is prevented by a super-lattice layer. Further, when an active layer is made of super-lattice films like a quantum-well structure, it is a matter of course that an element has the characteristics of a quantum-well laser, and the element can operate in shorter wavelength region than a laser which has a bulk active layer made of II-VI group, I-III-$VI_2$ group, or II-IV-$V_2$ group chalcopyrite type.

(a) When an active layer 3 is made of II-VI group compound semiconductor layer;

When an active layer 3 is a single layer, and clad layers 2 and 4 are a super-lattice structure, the composition of an active layer 3 may be;

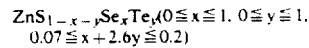

and the composition of clad layers may be;

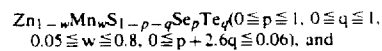

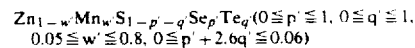

respectively.

On the other hand, when an active layer 3 is made of quantum-well structure, and clad layers 2 and 4 are a single layer, an active layer 3 has a quantum-well layer made of;

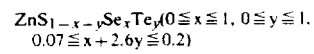

and a barrier layer made of;

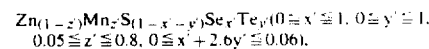

and the composition of clad layers 2 and 4 may be;

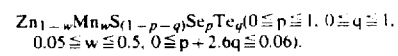

Further, when both layers (active layer and cladding layers) are super-lattice structure, a substrate 1 is made of Si or GaP.

The active layer 3 in that case has a quantum-well layer made of;

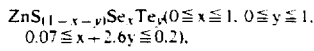
$ZnS_{(1-x-y)}Se_xTe_y (0 \leq x \leq 1, 0 \leq y \leq 1, 0.07 \leq x + 2.6y \leq 0.2)$, and a barrier layer made of:

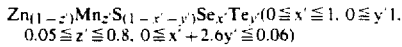
$Zn_{(1-z)}Mn_zS_{(1-x'-y')}Se_{x'}Te_{y'} (0 \leq x' \leq 1, 0 \leq y' 1, 0.05 \leq z' \leq 0.8, 0 \leq x' + 2.6y' \leq 0.06)$ The composition of the clad layers 2 and 4 are;

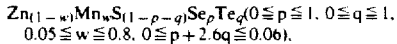
$Zn_{(1-w)}Mn_wS_{(1-p-q)}Se_pTe_q (0 \leq p \leq 1, 0 \leq q \leq 1, 0.05 \leq w \leq 0.8, 0 \leq p + 2.6q \leq 0.06)$.

and

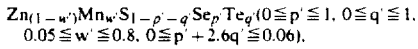
$Zn_{(1-w')}Mn_{w'}S_{1-p'-q'}Se_{p'}Te_{q'} (0 \leq p' \leq 1, 0 \leq q' \leq 1, 0.05 \leq w' \leq 0.8, 0 \leq p' + 2.6q' \leq 0.06)$.

respectively.

The above composition satisfies the lattice-matching to a substrate, the carrier confinement, and therefore, provides a short wavelength light with a layer structure which is easy in conduction type control.

(b) When an active layer 3 is made of I-III-VI$_2$ group compound semiconductor;

A practical structure is give by CuAlGa(SSe)$_2$ type which belongs to I-III-VI$_2$ group. A substrate is made of Si or GaP.

An active layer has a quantum-well layer made of;

$CuAl_xGa_{(1-x)}(S_ySe_{(1-y)})_2 (0.28 \leq x \leq 1, 0.45 \leq y \leq 0.62)$, and a barrier layer made of;

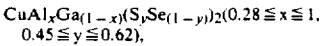
$Zn_{1-z'}Mn_{z'}S_{(1-x'-y')}Se_{x'}Te_{y'} (0 \leq x' \leq 1, 0 \leq y' \leq 1, 0 \leq z' \leq 0.6, 0 \leq x' + 2.6y' \leq 0.06)$, or $CuAl_{x''}Ga_{(1-x'')}(S_{y''}Se_{(1-y'')})_2 (0 \leq x'' \leq 1, 0 \leq y'' \leq 1)$.

The clad layers are super-lattice multi-layers structure made of;

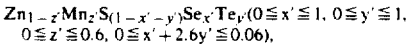
$Zn_{(1-w)}Mn_wS_{(1-p-q)}Se_pTe_q (0 \leq p \leq 1, 0 \leq q \leq 1, 0 \leq w \leq 0.6, 0 \leq p + 2.6q \leq 0.06)$ and

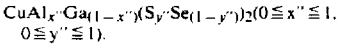
$Zn_{(1-w')}Mn_{w'}S_{(1-p'-q')}Se_{p'}Te_{q'} (0 \leq p' \leq 1, 0 \leq q' \leq 1, 0.05 \leq w' \leq 0.6, 0 \leq p' + 2.6q' \leq 0.06)$, respectively.

In the above composition, an element lattice-matched to a substrate, having excellent carrier confinement, and control of conduction type is easy.

(c) When an active layer 3 is made of II-IV-V$_2$ compound semiconductor;

The following composition is also possible. A substrate is made of GaP or Si, and an active layer is made of chalcopyrite type which belongs to II-IV-V$_2$ group.

The quantum-well layer of an active layer is made of;

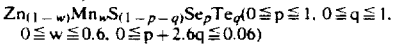
$Cd_xZn_{(1-x)}Ge_ySi_{(1-y)}P_2 (0.08 \leq x \leq 0.27, 0 \leq y \leq 0.8)$.

And, the barrier layer of the active layer is made of;

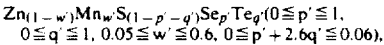
$Zn_{(1-z)}Mn_zS_{(1-x'-y')}Se_{x'}Te_{y'} (0 \leq x' \leq 1, 0 \leq y' \leq 1, 0 \leq z' \leq 0.6, 0 \leq x' + 2.6y' \leq 0.06)$.

or

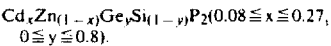
$Cd_{x''}Zn_{(1-x'')}Ge_{y''}Si_{(1-y'')}P_2 (0.08 \leq x'' \leq 0.27, 0 \leq y'' \leq 0.8)$

Embodiment 4

When a substrate is made of GaAs, Ge or ZnSe, the following composition of an active layer and clad layers provide the lattice matching to a substrate, excellent carrier confinement, and easy control of conduction type.

The composition of an active layer is;

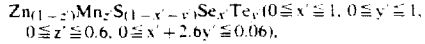
$ZnS_{1-x-y}Se_xTe_y (0 \leq x \leq 1.0 \leq y \leq 1.0, 8 \leq x + 2.6y \leq 1.0)$ or;

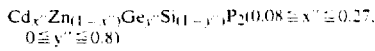
$Cd_xZn_{1-x}Ge_ySi_{1-y}P_2 (0.8 \leq x \leq 0.95, 0 \leq y \leq 0.25)$ The composition of clad layers is;

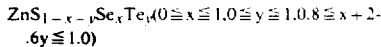
$Zn_{(1-w)}Mn_wS_{1-p-q}Se_pTe_q (0 \leq p \leq 1, 0 \leq q \leq 1, 0.05 \leq w \leq 0.5, 0.5 \leq p + 2.6q \leq 0.8$ or $0 \leq p + 2.6q \leq 0.06)$

Embodiment 5

When a substrate 1 is made of GaAs, Ge or ZnSe, one of the active layer and clad layers, or both may be super-lattice multi-layers structure.

(a) When an active layer 3 is made of II-VI group compound semiconductor;

The active layer has a quantum-well layer made of;

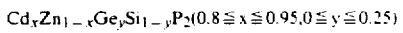
$ZnS_{1-x-y}Se_xTe_y (0 \leq x \leq 1.0 \leq y \leq 1.0, 8 \leq x + 2.6y \leq 1.0)$, and a barrier layer made of;

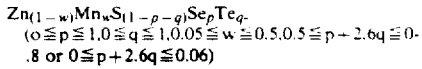
$Zn_{1-z'}Mn_{z'}S_{1-x'-y'}Se_{x'}Te_{y'} (0 \leq x' \leq 1.0 \leq y' \leq 1.0, 0.5 \leq z' \leq 0.8, 0.5 \leq x' + 2.6y' \leq 0.8)$ The clad layers 2 and 4 have the following compositions, respectively.

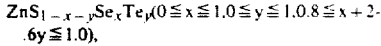
$Zn_{1-w}Mn_wS_{1-p-q}Se_pTe_q (0 \leq p \leq 1.0 \leq q \leq 1.0, 0.05 \leq w \leq 0.8, 0.5 \leq p + 2.6q \leq 0.8)$ and

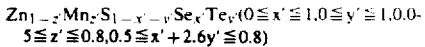
$Zn_{1-w'}Mn_{w'}S_{1-p'-q'}Se_{p'}Te_{q'} (0 \leq p' \leq 1.0 \leq q' \leq 1.0, 0.05 \leq w' \leq 0.8, 0.5 \leq p' + 2.6q' \leq 0.8)$ (b) When an active layer 3 is made of I-III-VI$_2$ compound semiconductor;

The active layer 3 has a quantum-well layer made of;

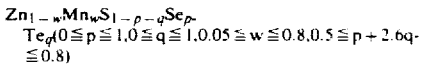
$Cd_xZn_{(1-x)}Ge_ySi_{(1-y)}P_2 (0.8 \leq x \leq 0.95, 0 \leq y \leq 0.25)$, and a barrier layer made of;

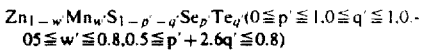
$Zn_{(1-z')}Mn_{z'}S_{(1-x'-y')}Se_{x'}Te_{y'} (0 \leq x' \leq 1.0 \leq y' \leq 1, 0.05 \leq z' \leq 0.8, 0.5 \leq x' + 2.6y' \leq 0.8)$ The clad layers have the super-lattice multi-layers structure made of;

$Zn_{(1-w)}Mn_wS_{(1-p-q)}Se_pTe_q$-
  $(0 \leq p \leq 1.0 \leq q \leq 1.0 \leq w \leq 0.8, 0.5 \leq p+2.6q \leq 0.8)$, and $Zn_{(1-w')}Mn_{w'}S_{(1-p'-q')}Se_{p'}Te_{q'}(0 \leq p' \leq 1.0 \leq q' \leq 1$
  $, 0.05 \leq w' \leq 0.8, 0.5 \leq p'+2.6q' \leq 0.8)$ As mentioned above, an element having a super-lattice structure for at least one of an active layer 3 and clad layers 2 and 4 provides the lattice matching to a substrate, an excellent carrier confinement, and easy control of conduction type. Thus, a short wavelength semiconductor light emitting element is obtained. The present embodiment has the similar advantages to those of the embodiment 3.

Embodiment 6

When a substrate 1 is a mixed crystal of GaAsP, the lattice constant is in the range between 5.45–5.64 Ångstrom depending upon the composition ratio.

The composition of an active layer 3 is;

$ZnS_{1-x-y}Se_xTe_y(0 \leq x \leq 1.0 \leq y \leq 1)$ the composition of clad layers 2 and 4 is;

$Zn_{1-w}Mn_wS_{1-p-q}Se_p$-
  $Te_q(0 \leq p \leq 1.0 \leq q \leq 1.0, 0.05 \leq w \leq 0.5)$ Alternatively, an active layer is;

$CuAl_xGa_{(1-x)}(S_ySe_{(1-y)})_2(0.28 \leq x \leq 1.0 \leq y \leq 0.62)$,
or $Cd_xZn_{(1-x)}Ge_ySi_{(1-y')}P_2(0.08 \leq x' \leq 1, $
  $0 \leq y' \leq 0.8)$ and clad layers are;

$Zn_{(1-w)}Mn_wS_{(1-p-q)}Se_p$-
  $Te_q(0 \leq p \leq 1.0 \leq q \leq 1.0, 0.05 \leq w \leq 0.6)$ The composition ratio of each layers is selected in the above range considering the lattice matching to a substrate 1. Then, a short wavelength light emitting semiconductor element which has excellent carrier confinement, and easy control of conduction type.

Embodiment 7

A substrate 1 is made of mixed crystal of GaAsP, and at least one layer of an active layer 3 and clad layers 2 and 4 is super-lattice multi-layers structure.

An active layer 3 has for instance a quantum-well layer;

$ZnS_{1-x-y}Se_xTe_y(0 \leq x \leq 1.0 \leq y \leq 1)$ and a barrier layer made of;

$Zn_{(1-z)}Mn_zS_{(1-x'-y')}Se_{x'}Te_{y'}(0 \leq x' \leq 1,$
  $0 \leq y' \leq 1, 0.05 \leq z' \leq 0.8)$ Clad layers 2 and 4 are as follows, respectively, and provide super-lattice multi-layer structure.

$Zn_{1-w}Mn_wS_{1-p-q}Se_p$-
  $Te_q(0 \leq p \leq 1.0 \leq q \leq 1.0, 0.05 \leq w \leq 0.8)$, and $Zn_{1-w'}Mn_{w'}S_{(1-p'-q')}Se_{p'}$-
  $Te_{q'}(0 \leq p' \leq 1.0 \leq q' \leq 1.0, 0.05 \leq w' \leq 0.8)$ The composition ratio is selected in the above range. Then, a short wavelength light emitting element having excellent carrier confinement and easy conduction type control is obtained.

When I–III–VI$_2$ group chalcopyrite type compound semiconductor is used, an active layer has a quantum-well layer made of;

$CuAl_xGa_{(1-x)}(S_ySe_{1-y})_2(0.28 \leq x \leq 1.0 \leq y \leq 0.62)$, and a barrier layer made of;

$Zn_{(1-z')}Mn_{z'}S_{(1-x'-y')}Se_{x'}Te_{y'}(0 \leq x' \leq 1,$-
  $0 \leq y' \leq 1, 0.05 \leq z' \leq 0.8)$ When II–IV–V$_2$ group chalcopyrite type is used, an active layer has a quantum-well structure made of;

$Cd_xZn_{(1-x)}Ge_ySi_{(1-y)}P_2(0.08 \leq x \leq 1.0 \leq y \leq 0.8)$.

This embodiment has the advantages similar to those in the embodiment 3.

Embodiment 8

When a substrate 1 is made of InP, a bulk ZnSSeTe group which is lattice-matched to said substrate can emit only red emission. A quantum-well structure can emit blue emission even in that substrate InP.

An active layer in this case has a quantum-well layer made of;

$ZnS_{(1-x-y)}Se_xTe_y(0 \leq x \leq 1.0 \leq y \leq 1, 0.85 \leq 0.6x - 1$
  $.6y \leq 1.15)$ and a barrier layer made of;

$Zn_{(1-z')}Mn_{z'}S_{(1-x'-y')}Se_{x'}Te_{y'}(0 \leq x' \leq 1.0 \leq y' \leq 1,$-
  $0.05 \leq z' \leq 0.8, 0.85 \leq 0.6x' + 1.6y' \leq 1.15)$ The depth of the well layer in this case is less than 100 Ångstrom.

Clad layers 2 and 4 are made of either;

$Zn_{1-w}Mn_wS_{(1-p-q)}Se_p$-
  $Te_q(0 \leq p \leq 1.0 \leq q \leq 1.0, 0.05 \leq w \leq 0.8, 0.85 \leq 0.6p +$-
  $1.6q \leq 1.15)$ or super-lattice structure with layers;

$Zn_{1-w}Mn_wS_{(1-p-q)}Se_p$-
  $Te_q(0 \leq p \leq 1.0 \leq q \leq 1.0, 0.05 \leq w \leq 0.8, 0.85 \leq 0.6p +$-
  $1.6q \leq 1.15)$ and $Zn_{1-w'}Mn_{w'}S_{1-p'-q'}Se_{p'}Te_{q'}(0 \leq p' \leq 1.0 \leq q' \leq 1.0,$-
  $05 \leq w' \leq 0.8, 0.85 \leq 0.6p' + 1.6q' \leq 1.15)$.

The above structure provides the lattice-matching to a substrate, excellent carrier confinement, and easy control of conduction type to emit short wavelength emission.

The above embodiments 1 through 8 have the feature that the clad layers 2 and 4 which contact with an active layer, are made of II-transition metal-VI group compound semiconductor, so that an energy barrier enough for confining carriers in an active layer, and control of conduction type of both n-type and p-type is easy.

We found that the clad layers 2 and 4 which contact with an active layer, made of composition that a part of II group element is substituted with transition metal absorbs light, and waveguide loss increases.

The following embodiment 9 solves that problem.

Embodiment 9

An active layer in this embodiment is made of II–VI group compound semiconductor.

Figure 5:
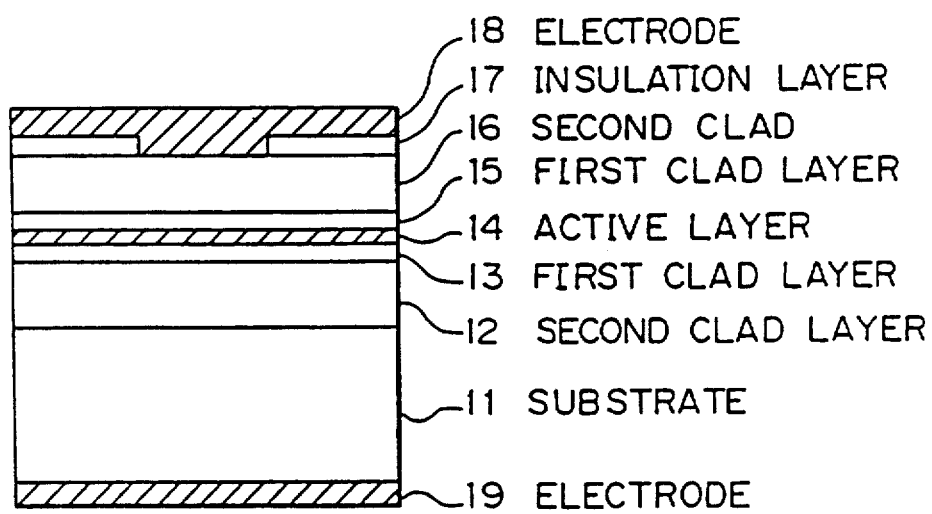
FIG. 5 shows another cross section of the semiconductor device according to the present invention.

FIG. 5 shows the cross section of a light emission element according to the present invention. In the figure, the numeral 11 is an n-GaP substrate, 12 is an n-side clad layer having the thickness about 2 μm, made of;

$$n\text{-}Zn_{0.82}Mn_{0.18}S_{0.98}Se_{0.01}Te_{0.01}.$$

The numeral 13 is an n-side inner clad layer (first clad layer) having the thickness about 0.2 μm, and the composition;

$$ZnS_{0.84}Se_{0.16}.$$

The numeral 14 is an active layer of the thickness about 0.2 μm, having the composition;

$$ZnS_{0.85}Se_{0.05}Te_{0.01}.$$

The numeral 15 is a p-side inner clad layer (first clad layer) having the thickness about 0.2 μm, and the composition;

$$ZnS_{0.84}Se_{0.16}.$$

The numeral 16 is a p-side outer clad layer (second clad layer) having the thickness about 2 μm, and the composition;

$$p\text{-}Zn_{0.82}Mn_{0.18}S_{0.98}Se_{0.01}Te_{0.01}.$$

The numeral 17 is an insulation layer, and the numerals 18 and 19 are electrodes for external connection.

The semiconductor structure of this embodiment is produced through the metal organic vapor phase epitaxy method (MOVPE). The clad layer 12 is doped with Cl (chlorine) and the clad layer 16 is doped with Li (litium) so that the carrier concentration is higher than $10^{18}$cm$^{-3}$. Then, an insulation layer, and electrode layers are deposited through conventional process.

Figure 6:
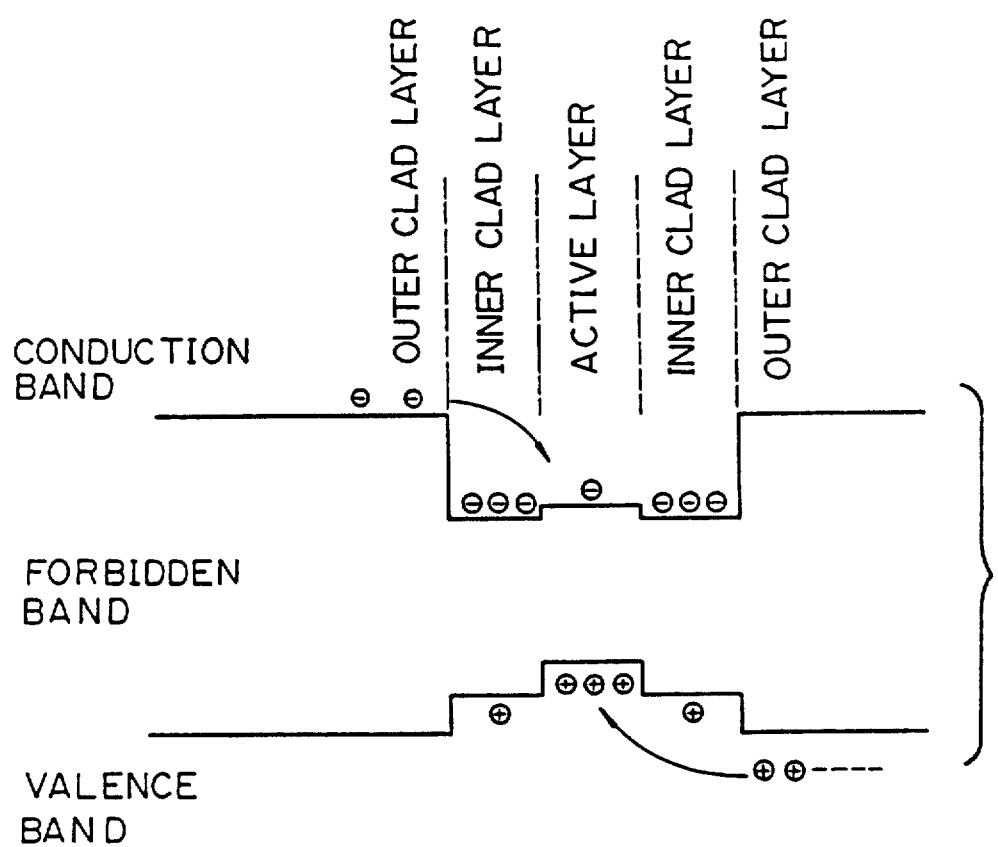
FIG. 6 shows the energy band structure of the semiconductor device of FIG. 5.

In the above structure, the lattice constants of the substrate 11, the clad layers 12, 13, 15 and 16 and the active layer 14 are almost lattice matched. The energy difference between the active layer 14 and the outer clad layers 12, 16 is approximately 0.3 eV. Although the hetero interface of the active layer 14 and the inner clad layers 13 and 15 is insufficient to confine an electron and a positive hole, the presence of the outer clad layers 12 and 16 provides a sufficient band discontinuity at the hetero interface between the inner clad layers (13, 15) and the outer clad layers (12, 16) for confining an electron and a positive hole completely, as shown in FIG. 6. It is supposed that the outer clad layers 12 and 16 has transition metal Mn which substitutes partly with II-group element so that electron affinity is reduced. In other words, the p-side and the n-side outer clad layers 12 and 16 provide the confinement of an electron and a positive hole effectively. Therefore, the proper selection of the thickness of the inner clad layers 13 and 15 provides the complete carrier confinement which provides the desired recombination of an electron and a positive hole.

Although Mn is included in the outer clad layers 12 and 16, the light absorption by Mn for light having the energy higher than 2.2 eV does not happen. The waveguide loss may be small by introducing the above structure in which a light does not go into the outer clad layers 12 and 16.

As mentioned in detail, the present embodiment has the feature that the inner clad layers (first clad layers) which face with the active layer are constituted by II–VI group compound semiconductor, and the outer clad layers (second clad layers) have the composition that a part of Zn which is II-group element is substituted with transition metal which includes Mn, Fe, Co and Ni, so that the active layer 14 and the clad layers 12, 13, 15, 16 are lattice-matched to the substrate 1, and the band structure is provided for the effective recombination of the carriers in the active layer 14. Thus, an injection type semiconductor light emission element for blue wavelength region (wavelength is 0.37 μm in the present embodiment) is obtained.

When green emission is desired, the value y in the active layer 14;

$$ZnS_{(1-x-y)}Se_xTe_y (0 \leq x \leq 1.0 \leq y \leq 1)$$

is increased, and the values q and q' in the inner clad layer and the outer clad layer;

$$ZnS_{(1-p-q)}Se_pTe_q (0 \leq p \leq 1.0 \leq q \leq 1), \text{ and}$$

$$Zn_{(1-w')}Mn_{w'}S_{(1-p'-q')}Se_{p'}\cdot Te_{q'}(0 \leq p' \leq 1.0 \leq q' \leq 1.0.05 \leq w' \leq 0.5)$$

are increased. It is preferable in this case that the substrate 11 is made of GaAs. The wavelength in this case is about 0.5 μm.

Also, an active layer of chalcopyrite type compound semiconductor, for instance; CuGa$_{0.1}$Al$_{0.9}$(S$_{0.53}$Se$_{0.47}$)$_2$ is also possible in the above embodiment, which has the first and the second cladding layers.

When the material of the substrate 11 is changed, or one of the active layers 14 and the outer clad layers 12, 16 is a super-lattice structure, the similar analysis to said embodiments 1 through 8 are possible.

Although the above embodiments have an n-type substrate 1 or 11, a p-type substrate is of course possible. The conduction type of the clad layers in that case is opposite to that of the above embodiments.

The n-type dopant may be Br, I, Al, Ga, In, and the p-type dopant may be Na, K, N, P, As, and Sb. The Mn may be substituted with Fe, Co, and/or Ni, which belongs to transition metal.

The present invention is applicable either to a laser, or a light emitting diode. In case of a laser, a buried heterostructure, and other transverse mode control structure are possible. Also, the application to a distributed feedback (DFB) laser, and a distributed Bragg reflector (DBR) laser is possible.

As mentioned above in detail, the composition of the clad layer 2, 12, 4, 16 has the feature that II-group element is partially substituted with transition metal element, so that a substrate, an active layer and cladding layers are almost lattice-matched, and the energy barrier is established enough for confining carriers in an active layer 3, 14, and further, the control of the conduction type of p-type and n-type is easy.

The light emission in blue or green region has become possible by the present invention. The present invention is useful in particular in the consumer products field, and the information processing field.

From the foregoing it will now be apparent that a new and improved light emitting semiconductor device has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A light emitting semiconductor device comprising;
a substrate,
an active layer and a pair of clad layers sandwiching said active layer, deposited on said substrate,
said substrate being made of one selected from GaAs, GaP, InP, Si, Ge, ZnSe and mixed crystal of GaAsP,
said active layer being made of at least one selected from II-VI group compound semiconductor, I-III-VI$_2$ group compound semiconductor, and II-IV-V$_2$ group compound semiconductor,
said clad layer being made of II-transition metal-VI group compound semiconductor, which is substantially lattice-matched to semiconductor of said active layer, and has higher energy gap than that of said active layer.

2. A light emitting semiconductor device according to claim 1, wherein said clad layer is comprised of a single layer located adjacent to said active layer.

3. A light emitting semiconductor device according to claim 1, wherein said clad layer includes a first clad layer which faces with one surface of said active layer, and a second clad layer which faces with the other surface of said first clad layer,
said first clad layer is composed of II-VI group compound semiconductor, and said second clad layer is composed of II-transition metal-VI group compound semiconductor.

4. A light emitting semiconductor device according to claim 1, wherein said transition metal is one selected from Mn, Fe, Co and Ni.

5. A light emitting semiconductor device according to claim 1, wherein said active layer and said clad layer are composed of single layers, respectively.

6. A light emitting semiconductor device according to claim 1, wherein at least one of said active layer and said clad layer has super-lattice structure which has a plurality of laminated ultra-thin films.

7. A light emitting semiconductor device according to claim 1, wherein said active layer is composed of II-VI group compound semiconductor.

8. A light emitting semiconductor device according to claim 1, wherein said active layer is composed of I-III-VI$_2$ group compound semiconductor.

9. A light emitting semiconductor device according to claim 1, wherein said active layer is composed of II-IV-V$_2$ compound semiconductor.

* * * * *